TRANSISTOR AMPLIFIER CIRCUIT

Filed Aug. 5, 1955 5 Sheets-Sheet 1

*INVENTORS*
FRANK A. HILL
DUANE A. LADINE
BY
Theodore H. Lassagne
ATTORNEY

Oct. 11, 1960 F. A. HILL ET AL 2,956,222

TRANSISTOR AMPLIFIER CIRCUIT

Filed Aug. 5, 1955 5 Sheets-Sheet 2

INVENTORS
FRANK A. HILL
DUANE A. LADINE

BY Theodore H. Lassagne

ATTORNEY

TRANSISTOR AMPLIFIER CIRCUIT

INVENTORS
FRANK A. HILL
DUANE A. LADINE
BY Theodore H. Lassagne
ATTORNEY

TRANSISTOR AMPLIFIER CIRCUIT

Filed Aug. 5, 1955 5 Sheets-Sheet 4

INVENTORS
FRANK A. HILL
DUANE A. LADINE
BY
Theodore H. Lassagne
ATTORNEY

Oct. 11, 1960 F. A. HILL ET AL 2,956,222

TRANSISTOR AMPLIFIER CIRCUIT

Filed Aug. 5, 1955 5 Sheets-Sheet 5

INVENTORS
FRANK A. HILL
DUANE A. LADINE

BY Theodore H. Lassagne

ATTORNEY 2,956,222
Patented Oct. 11, 1960

2,956,222

TRANSISTOR AMPLIFIER CIRCUIT

Frank A. Hill, Van Nuys, and Duane A. Ladine, Burbank, Calif., assignors to General Precision, Inc., a corporation of Delaware Filed Aug. 5, 1955, Ser. No. 526,674

29 Claims. (Cl. 323—89)

This invention relates to amplifiers and more particularly to amplifiers using semi-conductor members in which the semi-conductor members are operated at high efficiency. The invention especially relates to amplifiers using semi-conductor members in which the semi-conductor members are modulated in time by substantially rectangular signals to obtain a peak operating performance of the semi-conductor members.

In recent years, the field of technology has so advanced in many directions that responses must be obtained which are far more sensitive than those required in previous years. For example, tools must cut members such as cams with accuracies which are considerably greater than those previously required. In order to obtain such accuracies of response, signals representing errors in the movements of the tool are generated. Since these signals have a relatively low amplitude, they are first amplified. The signals are then introduced to the tool or other output member to adjust the movements of the tool in a direction for eliminating the errors.

Semi-conductors are becoming more widely used to provide an amplification of control signals. The semi-conductors use material such as germanium which has properties for holding an abundance of electrons or an abundance of positive charges. The semi-conductors are formed by disposing in contiguous relationship layers of material having excesses of electrons and layers of material having excesses of positive charges. Current is made to flow through the resultant semi-conductor upon the introduction of an input signal. Under certain circumstances, the output current produces a signal which is considerably amplified with respect to the input signal.

One of the problems in semi-conductors results from the dissipation of heat in the semi-conductors. When an excessive amount of heat is dissipated in a semi-conductor, the semi-conductor loses its desirable properties of response and deteriorates rapidly. Many attempts have been made to produce amplified output signals in semi-conductors in accordance with the introduction of input signals to the semi-conductors and without an excessive amount of heat dissipation. However, these attempts have not been entirely successful.

This invention provides amplifiers using semi-conductors in which the semi-conductors are modulated by a substantially rectangular signal. By modulating the semi-conductor in this way, peak currents are obtained through the semi-conductor at the time that substantially no voltage is produced across the semi-conductor. At the times that high voltages are produced across the semi-conductor, substantially no current is obtained through the semi-conductor. In this way, the power dissipation in the semi-conductor is held to a relatively low value. Because of this, the semi-conductor cannot become excessively heated, even when large output signals are obtained from the semi-conductor.

The amplifiers constituting this invention are especially adapted to be used with magnetic amplifiers. Magnetic amplifiers are desirable since they convert input signals to signals having sharp rising and trailing characteristics. These signals are then introduced to the amplifier stages including the semi-conductors to obtain further amplification. The "ultra fast" magnetic amplifiers described and claimed in co-pending application Serial Number 412,796, filed February 26, 1954, now Patent No. 2,827,603, by Joseph A. Fingerett and Frank A. Hill are especially desirable. These magnetic amplifiers are especially desirable because they provide output signals in the same half cycles as the input signals and in a polarity dependent upon the polarity of the input signals. In this way, the amplifiers formed by stages of magnetic amplifiers and semi-conductors give strong and fast responses to an input signal.

Figure 1:
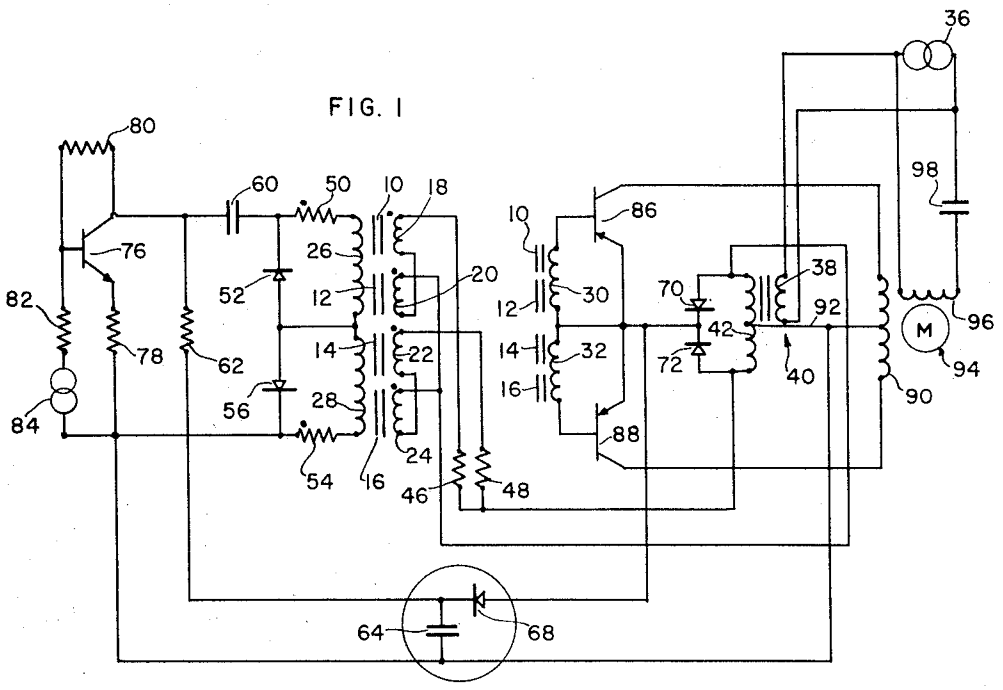
Figure 1 is a circuit diagram of an amplifier constituting one embodiment of this invention.
Figure 4:
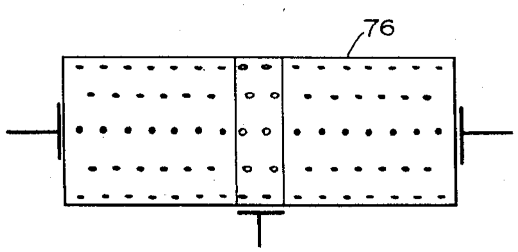
Figure 5:
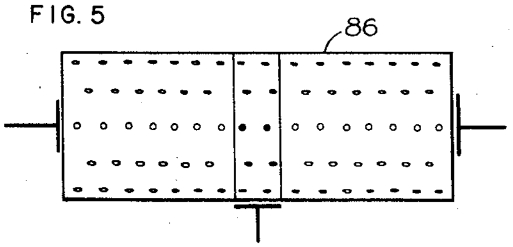
Figure 6:
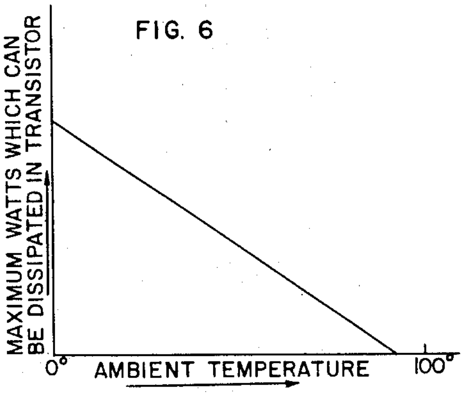
Figure 7:
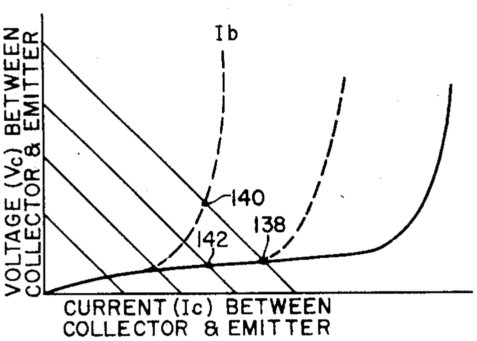

Figures 3*a* to 3*f*, inclusive, show curves illustrating voltage wave forms at strategic terminals of the embodiment shown in Figure 1;

Figure 4 is an enlarged view somewhat schematically illustrating the construction and operation of an NPN transistor included in the embodiment shown in Figure 1;

Figure 5 is an enlarged view somewhat schematically illustrating the construction and operation of a PNP transistor, a pair of which are included in the embodiment shown in Figure 1;

Figure 6 shows curves illustrating the maximum heat which can be safely dissipated in a transistor for various ambient temperatures around the transistor;

Figure 7 shows curves illustrating the relationships between different voltages and currents for a typical transistor; and Figures 8 to 14, inclusive, somewhat schematically illustrate circuits forming different embodiments of the invention.

In the embodiment of the invention shown in Figure 1, a magnetic amplifier is adapted to receive input signals and to convert these signals into a proper form for introduciton to subsequent amplifier stages which include semi-conductors such as transistors. The magnetic amplifier includes a first pair of cores 10 and 12 and a second pair of cores 14 and 16. Each of the cores 10, 12, 14 and 16 may be made from material manufactured by Magnetics, Inc. of Butler, Pennsylvania, and designated as "Orthonol" by that company. The particular cores used may be purchased from Magnetics, Inc. by their trade number 50061–2A. These cores have a toroidal shape, such a shape being advantageous since it provides a closed loop for the travel of magnetic flux without any air gaps in the loop. The core material in the toroids is composed of approximately fifty percent nickel and fifty percent iron and is made from material which is rolled only in a particular direction and which is annealed in hydrogen to grain orient the material.

Line windings 18, 20, 22 and 24 are respectively disposed in magnetic proximity to the cores 10, 12, 14 and 16. The line windings are preferably formed from a plurality of turns of wire wound on the cores to obtain an optimum magnetic coupling with the cores. For example, each of the windings 18, 20, 22 and 24 may be formed from approximately 950 turns of number 32 wire. However, the line windings 10, 12, 14 and 16 may be formed in any other suitable manner to produce a magnetic coupling between the windings and their associated cores.

Input windings are magnetically associated with each of the cores 10, 12, 14 and 16. As one possibility, a separate input winding may be wound on each of the cores. As another possibility one winding may be wound on each pair of cores when the cores in a pair are disposed in contiguous relationship to each other in the axial direction. For example, one winding 26 may be formed from a plurality of turns of wire looped around the cores 10 and 12 when the cores are disposed in pancake fashion with a common axis. The winding 26 may be formed from approximately 225 turns of number 34 wire. Similarly, a single winding 28 may be formed from a plurality of turns of wire looped around both of the cores 14 and 16. The winding 28 may have characteristics corresponding substantially to those of the winding 26.

Output windings are also magnetically associated with each of the cores 10, 12, 14 and 16. A separate output winding may be magnetically coupled to each of the cores 10, 12, 14 and 16 or a single winding may be disposed in magnetic proximity to a pair of cores. For example, a winding 30 may be formed from a plurality of turns of wire extending around both of the cores 10 and 12 when the cores are disposed in axial alignment. The winding 30 may be formed from approximately 500 turns of number 34 wire. Similarly, a winding 32 having characteristics corresponding to those of the winding 30 may be magnetically coupled to both of the cores 14 and 16.

Each of the line windings 18, 20, 22 and 24 is adapted to receive line voltage from a suitable source 36 of alternating voltage. The source 36 is adapted to provide alternating voltage at a suitable frequency such as 60 cycles but variations in frequency from the suitable frequency are not critical. The signals from the voltage source 36 are applied to the primary winding 38 of a transformer generally indicated at 40. The transformer 40 has a secondary winding 42 so related to the primary winding as to apply to the windings 18, 20, 22 and 24 alternating signals having a suitable amplitude such as 42 volts.

The line windings 18 and 20 and a resistance 46 having a suitable value such as approximately 500 ohms are in series with the secondary winding 42. The line windings 18 and 20 are connected in the series circuit to produce magnetic flux on a differential basis relative to the flux produced by the flow of current through each of the windings 26 and 30. The differential relationship of the windings 18 and 20 is obtained by connecting to each other the bottom terminals of the windings 18 and 20 in Figure 1. The differential connection of the windings 18 and 20 causes magnetic flux of one polarity to be produced in the core 10 and magnetic flux of an opposite polarity to be produced in the core 12 upon a flow of current through the windings 18 and 20.

The windings 22 and 24 are also in a series circuit with the secondary winding 42 and with a resistance 48 having a value corresponding to that of the resistance 46. The windings 22 and 24 are connected in the series circuit to produce magnetic flux on a differential basis in the cores 14 and 16 relative to the flux produced in the core by the flow of current through the input winding 28 or the output winding 32. The differential relationship of the windings 22 and 24 is obtained by connecting the bottom terminals of the windings in Figure 1.

A series circuit formed by a resistance 50 and a unidirectional member such as a diode 52 is connected across the input winding 26. The resistance 50 may have a suitable value such as approximately 2000 ohms. The diode 52 may be a germanium diode such as that manufactured by the Hughes Aircraft Company and identified as "1N–100" by that company. The cathode of the diode 52 has a common terminal with the resistance 50 and the plate of the diode has a common connection with the lower terminal of the winding 26 in Figure 1.

In like manner, a resistance 54 and a diode 56 are in series across the input winding 28. The resistance 54 and the diode 56 respectively have characteristics corresponding to the resistance 50 and the diode 52. The diode 56 is connected in the circuit such that its plate has a common terminal with the plate of the diode 52 and its cathode has a common terminal with the resistance 54.

A capacitance 60 having a suitable value such as approximately one microfarad is connected to the common terminal between the resistance 50 and the cathode of the diode 52. The capacitance 60 is in series with a resistance 62 having a suitable value such as approximately 2000 ohms and with a capacitance 64 having a suitable value such as approximately 1.5 microfarads. The capacitance 64 is in turn connected to the common terminal between the resistance 54 and the cathode of the diode 56.

A unidirectional member such as a diode 68 has its cathode connected to the common terminal between the resistance 62 and the capacitance 64. The diode 68 may be a germanium diode such as that manufactured by Hughes Aircraft Company and designated as 1N67A by that company. Connections are made from the plate of the diode 68 to the cathodes of diodes 70 and 72. The diodes 70 and 72 may be germanium diodes such as those manufactured by the General Electric Company and designated as "IN93" by that company. The plates of the diodes 70 and 72 have common connections with the opposite terminals of the secondary winding 42.

A connection is made from the collector of a semiconductor such as a transistor 76 to the common terminal between the capacitance 60 and the resistance 62. The transistor 76 may be of the NPN type such as that manufactured by the Texas Instrument Company and designated as "X–15" by that company. The emitter of the transistor 76 is connected to one terminal of a resistance 78 having a suitable value such as approximately 50 ohms. The other terminal of the resistance 78 has a common connection with the resistance 54 and the cathode of the diode 56.

A resistance 80 having a suitable value such as approximately 36,000 ohms is connected between the collector and base of the transistor 76. A resistance 82 having a suitable value such as approximately 2000 ohms and a source 84 of signal energy are in series between the base of the transistor 76 and the common terminal between the resistances 78 and 54. The source 84 is shown in Figure 1 as being adapted to provide an alternating signal but the source may also apply a signal of direct voltage.

The windings 30 and 32 are included in an output circuit. The lower terminal of the winding 30 and the upper terminal of the winding 32 are shown in Figure 1 as being connected to the cathodes of the diodes 70 and 72. The upper terminal of the winding 30 is connected to the base of a semi-conductor such as a transistor 86 and the lower terminal of the winding 32 is connected to the base of a semi-conductor such as a transistor 88. The transistors 86 and 88 may be of the PNP type. Transistors suitable for use as the members 86 and 88 are manufactured by the Minneapolis-Honeywell Company and are designated as "H–2" by that company.

The emitters of the transistors 86 and 88 have a common connection with the cathodes of the diodes 70 and 72. The collectors of the transistors 86 and 88 are connected to the opposite extremeties of a load such as a winding 90. The winding 90 has a center tap which is connected through a line 92 to a center tap in the secondary winding 42. The winding 90 forms a part of a motor which is generally indicated at 94 and which also includes a winding 96 disposed in perpendicular relationship to the winding 90. The winding 96 is adapted to receive alternating voltage from the source 36 through a coupling capacitance 98.

It is well known that a magnetic core produces a changing magnetic flux when a voltage is applied to a winding supported on the core. If a voltage is applied to the winding for a sufficient period of time, the core may become magnetically saturated. The core becomes negatively magnetically saturated when a voltage of a first polarity is applied to the winding on the core for a particular period of time. The core becomes positively saturated when the same voltage of the opposite polarity is applied to the winding for the same length of time.

During the time that a core is not saturated, it produces increasing amounts of magnetic flux as a voltage of one polarity is applied. For certain core materials such as that used in the cores of this embodiment, small increases in current may cause large increases in the rate of change of magnetic flux. Since increases in the rate of change of flux are equivalent to electromotive force—in other words, voltage—a large increase in voltage can be produced by a small increase in current (incremental magnetizing current) when the core remains unsaturated. This may be seen by the steep sides of the curve shown in Figure 2, such sides being designated as 100 and 102. Because of the large increase in voltage required to produce a small increase in current, the impedance presented by the winding may be relatively large during periods of core unsaturation. For example, each of the output windings 30 and 32 may have impedances in excess of 100,000 ohms when their associated cores remain unsaturated.

When a core becomes magnetically saturated, increases in current through its associated winding produce substantially no increase in magnetic flux. Because of the lack of any increase in flux in the core, no voltage is induced in the winding. This may be seen by the horizontally flat portions 104 and 106 in the hysteresis loop shown in Figure 2. Since impedance is represented by the ratio between the voltage and the current, the winding has substantially zero impedance when its associated core becomes saturated. For example, the impedance presented by the core 10 to the winding 30 becomes very low when the core becomes saturated.

The performance of a magnetic core at any instant is dependent upon certain characteristics of the core. For example, the performance of the core is dependent, among other factors, upon the cross-sectional area of the core and the magnetic material from which it is made. The characteristics of the core in turn determine how long a period of time is required to change the core from a negative saturation to a positive saturation, or vice versa, when a particular voltage is imposed on the winding associated with the core. Increases in voltage result in a decrease in the time required to change the polarity of core saturation. Similarly, increased periods of time are required to saturate a core for decreases in voltage applied to the associated winding.

The combination of voltage and time required to convert a core from one polarity of saturation to the opposite polarity of saturation has been defined as the "volt-seconds capacity" of the core. The term "volt-seconds" can be mathematically described as the integral of voltage with respect to time. Thus, $$\text{volt-seconds} = \int_0^t V dt$$

where $V$=the voltage at any instant; and
$dt$=an infinitesimal increase in time from that instant.

Figure 2:
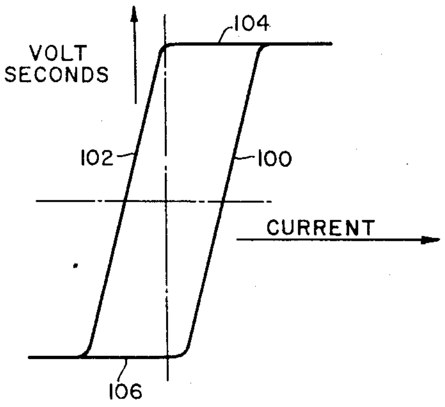
Figure 2 shows a curve illustrating the performance of certain magnetic components forming a part of the embodiment shown in Figure 1.

Since the volt-seconds level of a core at any instant is dependent upon the value of the volt-seconds which have been applied through an associated winding previous to that instant, the curve shown in Figure 2 represents the relationship between current and volt-seconds. The value of the current is represented along the horizontal axis and the amount of volt-seconds is represented along the vertical axis. As will be seen in Figure 2, the portions 100 and 102 are relatively steep and the portions 104 and 106 are relatively flat such that a response curve approaching a rectangle is produced. Such a response curve is desirable for reasons which will become apparent in the subsequent discussion.

During alternate half cycles, the source 36 has a positive voltage on its left terminal and a negative voltage on its right terminal. These half cycles of voltage are illustrated at 110 in Figure 3*a*. In these half cycles, current flows through the primary winding 38 of the transformer 40 and induces in the secondary winding 42 a voltage having a positive polarity at the upper terminal of the winding and a negative polarity at the lower terminal of the winding.

The voltage in the secondary winding 42 in the positive half cycles causes current to flow downwardly in Figure 1 through the winding 20 and upwardly through the winding 18. Since the windings 18 and 20 and the cores 10 and 12 have substantially similar characteristics, the currents flowing through the windings 18 and 20 produce equal volt-seconds in the cores. This is respectively illustrated at 112 and 114 in Figures 3*c* and 3*d* for the cores 10 and 12. This would cause the cores 10 and 12 to become saturated at substantially the same time in the half cycles when no signal is produced in the source 84. Upon the saturation of the cores 10 and 12, no voltage would be produced in the output winding so associated with the cores, as indicated at 116 and 118 for the voltage contributed individually by the cores. In like manner, an equal number of volt-seconds would be produced in the cores 14 and 16 by the flow of current through the windings 22 and 24. This would cause the cores 14 and 16 to saturate at substantially the same instant in the half cycles when no signal current flows through the input winding 28.

When current flows through the input winding 26, it causes flux to be produced in the cores 10 and 12 on a differential basis relative to the flux produced by the flow of current through the windings 18 and 20. For example, current may flow downwardly in Figure 1 through the winding 26 at the same time as the occurrence of a positive half cycle of voltage from the source 36. Under such a set of circumstances, the flux produced in the core 12 by the flow of current through the winding 26 will aid the flux produced in the core by the flow of current through the winding 20. However, the flux produced in the core 10 by the flow of current through the winding 26 is in a direction opposite to the flux produced in the core by the flow of current through the winding 18.

Since the core 12 would be receiving more volt-seconds than the core 10 under the conditions described in the previous paragraph, it would saturate first in the positive half cycles of voltage from the source 36. When the core 12 saturates, the impedance presented by the core to the output winding 30 would become negligible. However, a voltage would be induced in the output winding 30 by the flux produced in the core 10 since this core still remains unsaturated. The voltage induced in the output winding 30 produces a flow of current through an output circuit, as will be described in detail hereinafter.

In the negative half cycles of voltage from the source 36, current flows downwardly in Figure 1 through the winding 18 and upwardly through the winding 20. The current through the winding 18 produces volt-seconds in the core 10 in the same direction as the volt-seconds onds produced in the ocre 12 by the flow of current through the input winding 26. However, the volt-seconds produced in the core 12 by the flow of current through the winding 26 would be in an opposite direction to the volt-seconds produced in the core by the flow of current upwardly through the winding 20. This would cause the core 10 to saturate before the core 12 in the negative half cycles of voltage from the source 36.

The current flowing through the input winding 26 is produced by a signal in the source 84. A positive signal from the source 84 may be considered as a relatively high voltage on the upper terminal of the source 84 and a relatively low voltage on the lower terminal of the source. This voltage is applied between the emitter and base of the transistor 76 to produce an increased flow of current in a manner which will be described in detail subsequently.

The operation of the NPN transistor 76 may be seen from the diagram shown in Figure 4. As may be seen, the left and right portions of the transistor 76 are of the N type in which an excess of electrons exists. An excess of electrons is represented by solid circles in Figure 4. The middle portion of the transistor is of the P type in which an excess of positive charges exists. An excess of positive charges is represented by hollow circles in Figure 4. The emitter of the transistor is connected to the left end of the transistor and the base of the transistor is connected to the P portion of the transistor.

In the positive half cycles of voltage from the source 36, current flows through a circuit including the secondary winding 42, the diode 70, the diode 68 and the capacitance 64. This current charges the capacitance 64 to produce a positive voltage on the upper terminal of the capacitance in Figure 1. In the negative half cycles of voltage from the source 36, current flows through a circuit including the winding 42, the diode 72, the diode 68 and the capacitance 64. This current tends to charge the capacitance 64 in the same polarity as the current flowing in the positive half cycles of voltage. In this way, the diodes 70 and 72, the diode 68 and the capacitance 64 act as a full wave rectifier to produce a substantially direct voltage across the capacitance.

The voltage across the capacitance 64 is applied to the transistor 76 in a direction to bias the emitter with a negative polarity relative to the collector and the base. Because of this bias, electrons in the N portion at the left portion of the transistor are attracted toward the base to produce a current. Electrons are attracted toward the base because of the excess of electrons in the emitter of the transistor.

The collector of the transistor 76 is biased with a positive voltage relative to the base and emitter because of its connection through the resistance 62 to the positive terminal of the capacitance 64. Since the collector is positively biased, it draws most of the electrons travelling toward the right from the left N section to the P section. The collector draws most of the electrons because of the movement previously initiated by the base. The electrons move toward the right past the base since the collector is connected to the right side of the transistor. Because of the flow of most of the electrons toward the collector, the electron flow from the emitter to the collector is amplified over the electron flow from the emitter to the base.

Upon the production of a negative signal by the source 84, a negative voltage is applied to the base. This produces a decreased flow of electrons from the emitter to the base and from the emitter to the collector. Since a decreased flow of electrons can be considered as a decrease in current, positive current can be considered as flowing through a circuit including the capacitance 60, the resistance 50, the winding 26, the diode 56, the resistance 78 and the emitter and collector of the transistor 76. The current flows through the diode 56 rather than the winding, since the diode effectively shorts the winding. Only the signal current and not the bias current flows through the winding 26 because of the action of the capacitance 60.

The current flowing through the winding 26 produces a temporal separation in the saturation of the cores 10 and 12 in a manner similar to that described above. As described above, the core 12 saturates before the core 10 in the positive half cycles of voltage from the source 36. Upon the saturation of the core 12, the impedance presented by the core to the winding 30 becomes low and the voltage induced in the winding by the action of the core becomes substantially zero as indicated at 120 in Figure 3*c*. This causes the voltage induced in the winding 30 by the flux in the core 10 to be presented with a low impedance for the flow of current through a circuit including the winding and the base and emitter of the transistor 86. The voltage induced in the winding 30 after the saturation of the core 12 is indicated at 126 in Figure 3*e* and is produced almost entirely by the action of the flux in the core 10.

Since the transistor 86 is of the PNP type, the end portions are of the P type and the middle portion is of the N type, as shown in Figure 5. This causes the end portions of the transistor to have an excess of positive charges (or "holes") and the middle portion to have an excess of electrons. The electrons are represented in Figure 5 by solid circles and the holes by hollow circles in a manner similar to that shown in Figure 4 and described fully above. When a signal is induced in the winding 30, it is in a direction to produce a positive voltage on the emitter relative to the voltage on the base. This voltage causes the holes in the left P section to be repelled by the emitter towards the base. Most of the holes continue past the base to the collector because of the positive voltage applied to the emitter from the secondary winding 42 in each half cycle of line voltage. The positive voltage is applied to the emitter of the transistor 86 through the diode 70 in the positive half cycles and through the diode 72 in the negative half cycles.

Since most of the holes travel to the collector, the current produced between the emitter and the collector is amplified with respect to the current obtained between the emitter and the base. In this way, the signal induced in the winding 30 by the flux in the core 10 is amplified by the transistor 86. The amplified current flows through a circuit including the emitter and collector of the transistor 86, the upper half of the winding 90 in Figure 1, the upper half of the secondary winding 42 in Figure 1 and the diode 70. The current produces an output pulse in the winding 90, which is similar to that indicated at 126 in Figure 3*e*. The current produces in the winding 90 a magnetic field which cooperates with the field produced by the flow of current through the winding 96 to produce a rotation of the motor 94. The motor 94 rotates in a direction dependent upon the direction of current flow through the winding 90 and through an angle per unit time dependent upon the strength of the magnetic field produced by the flow of current in the winding 90.

During the time that an output signal is produced in the winding 90, line current continues to flow through the winding 18. This causes the volt-seconds produced in the core 10 to increase so that the core eventually saturates in the same half cycle as the core 12. Upon the saturation of the core 10, the voltage induced in the winding 30 becomes zero, as indicated at 124 in Figure 3*e*. When this occurs, no further voltage is induced in the output winding 30 during the remainder of the half cycle.

Since the core 10 has a substantially rectangular hysteresis loop as shown in Figure 2, the change in the core from an unsaturated to a saturated level occurs almost instantaneously. For this reason, the trailing edges of the voltage pulse 122 (Figure 3*d*) induced in the output winding 30 and of the output pulse 126 have relatively steep trailing characteristics. This is important for reasons which will be described in detail subsequently.

Figures 3A, 3B, 3C, 3D, 3E:
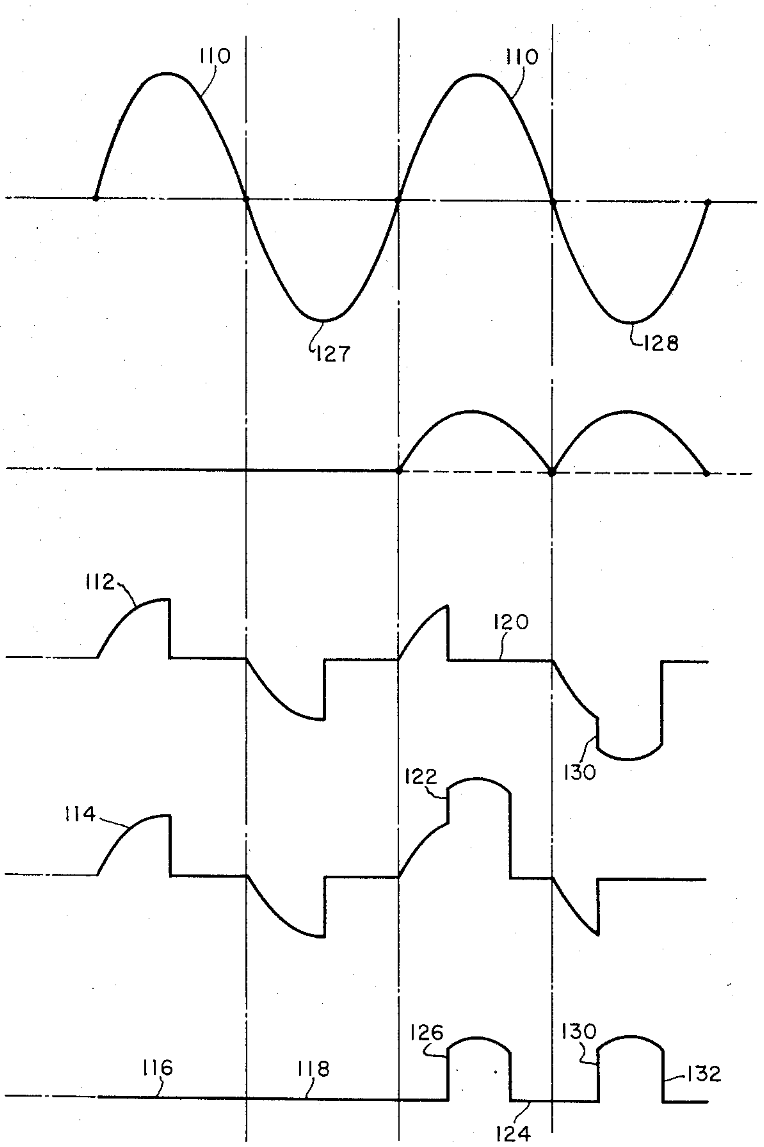

In the negative half cycles of voltage from the source 36, such as those indicated at 128 in Figure 3*a*, the core 10 saturates before the core 12 when signal current flows downwardly in Figure 1 through the input winding 26. Upon the saturation of the core 10, a voltage indicated at 130 in Figure 3*e* is induced in the winding 30 by the flux in the core 12. This voltage causes a signal current to flow through a circuit including the winding 30 and the emitter and base of the transistor 86. The current flowing between the emitter and base of the transistor 86 is amplified by transistor 86 to produce a flow of current through a circuit including the emitter and collector of the transistor 86, the upper half of the winding 90 in Figure 1, the bottom half of the winding 42 and the diode 72. This causes an output pulse of voltage similar to that indicated at 132 in Figure 3e to be produced in the winding 90. The output current through the winding 90 continues until the saturation of the core 12 in the negative half cycles of line voltage from the source 36 in a manner similar to that described above.

When a positive signal is produced on the upper terminal of the source 84, it produces an increased positive bias on the base of the transistor 76 relative to the potential on the emitter. This positive bias causes an increased number of electrons to flow toward the base. Most of these electrons continue toward the collector because of the high positive voltage on the collector. Since an increased flow of electrons occurs from the emitter to the collector of the transistor 76, an increased positive current can be considered as flowing from the collector to the emitter.

The increased positive current through the transistor 76 flows through a circuit including the transistor, the resistance 78, the resistance 54, the winding 28, the diode 52 and the capacitance 60. The current flows through the diode 52 rather than the winding 26 since the diode effectively short circuits the winding. The current flows through the winding 28 on a differential basis relative to the flow of line current through the windings 22 and 24. Because of this differential relationship, a temporal separation is produced in the saturation of the cores 14 and 16 in each half cycle of line voltage.

In the positive half cycles from the source 36, as represented by a positive voltage on the upper terminal of the secondary winding 42 in Figure 1, the core 14 saturates before the core 16. Upon the saturation of the core 14, the voltage induced in the winding 24 by the flux in the core 16 produces a flow of current between the emitter and base of the transistor 88. This in turn produces an amplified flow of current through a circuit including the collector and emitter of the transistor 88, the lower half of the winding 90 in Figure 1, the upper half of the winding 42 and the diode 70. The amplified current continues until the saturation of the core 16 in the positive half cycles of voltage from the source 36.

In like manner, the core 16 saturates before the core 14 in the negative half cycles of voltage from the source 36. When the core 16 saturates, amplified current flows upwardly through the winding 90 in Figure 1 in a manner similar to that described above. The current continues until the core 14 saturates in the negative half cycles of voltage. Since current flows upwardly through the winding 90 in Figure 1, the motor 94 has a rotation imparted to it in an opposite direction relative to the rotation imparted to it by the flow of current in a downward direction through the winding.

During the time that both of the cores in a pair are in their saturated or unsaturated state, no current flows through the transistors 86 or 88. This causes the transistors to act as a switch such that the full voltage from the secondary winding 42 is produced across the switch. Even though a high voltage is developed across the transistors 86 and 88 at this time, no power is consumed in the transistors because of the absence of any current flow.

The windings 30 and 32 in effect respectively operate as biasing means to prevent the transistors 86 and 88 from becoming conductive during the time that both the cores 10 and 12 remain unsaturated. This results from the high impedance respectively produced in the windings 30 and 32 when both the cores 10 and 12 or both the cores 14 and 16 are unsaturated. However, when one of the cores in a pair such as the core 10 in the pair formed by the cores 10 and 12 becomes saturated, the winding 30 in effect starts to act as a generator which has a high internal impedance produced by the unsaturated core 12 in the pair. The impedance of the circuit connected to this generator is sufficiently low to produce a state of conductivity between the emitter and base of the transistor 86. This current produces an amplified flow of current between the emitter and the collector of the transistor until the second core in the pair such as the core 12 in the pair formed by the cores 10 and 12 becomes saturated.

Upon the saturation of one of the cores in a pair such as the cores 10 and 12 or the cores 14 and 16, an instantaneous flow of current is obtained between the emitter and base of one of the transistors 86 or 88. The current rises almost instantaneously to a high level since the signal introduced to the transistor has a steep rising edge. This results from the rectangular hysteresis characteristics of the cores 10, 12, 14 and 16 as shown in Figure 2 and from the almost instantaneous conversion of the cores from an unsaturated to a saturated state. The sharp characteristics of the current pulse produced in the transistors 86 and 88 are illustrated at 126 and 132 in Figure 3e.

Since the current in the transistors changes almost instantaneously from a zero level to a high level, a signal of large amplitude is almost instantaneously produced across the load such as the winding 90. Because of the production of a large signal across the load, practically no voltage is produced between the collector and emitter of the conductive transistor. In this way, relatively little power is dissipated in the transistor even though a large current flows through the transistor.

Dissipating a minimum amount of heat in a transistor is important to insure a proper operation of the transistor at peak efficiency. When an excessive amount of heat is dissipated in the transistor, it deteriorates rapidly. As the transistor starts to deteriorate, it dissipates more heat. This causes a cycle of operation to be produced in which the transistor has to be replaced within a relatively short time. This is undesirable because of the high cost of transistors and because of the time during which the equipment including the transistors cannot operate.

Figure 6 shows curves which illustrate graphically how important it is to keep the ambient temperature of the transistor as low as possible. In Figure 6, ambient temperatures around a typical transistor are illustrated along the horizontal axis. The vertical axis in Figure 6 indicates the maximum power which can be dissipated in the transistor for the ambient temperature shown along the horizontal axis. As will be seen, the maximum power capable of being safely dissipated in a transistor decreases rapidly as the ambient temperature increases. When the transistor dissipates power in excess of this maximum value, the performance of the transistor deteriorates rapidly as described in the previous paragraph, and the transistor has to be quickly replaced.

By providing a signal having rectangular characteristics in the embodiment shown in Figure 1 and described fully above, low power dissipation is obtained in the transistors such as the transistors 86 and 88. The advantage of this circuit or mode of operation is that high power loads can be driven from small transistors, and relatively little heat will be generated in the transistors. In addition, high power loads can be driven at a higher ambient temperature with any given transistors. This results from the fact a transistor dissipating little power can be operated at a higher ambient temperature, as shown in Figure 6.

The amplifier shown in Figure 1 and described fully above is advantageous for other reasons. Ordinarily, transistors such as the transistors 86 and 88 would continue to conduct after the end of an input pulse. The transistor would continue to conduct because the movement of the holes to the collector has not been completely eliminated. However, by using magnetic amplifiers to produce signals for introduction to the transistors, the transistors become cut off almost instantaneously after the end of the pulse from the magnetic amplifier. This results from the fact that the impedance presented by the magnetic amplifier becomes relatively low when both of the cores in the magnetic amplifier become saturated. Only the resistance of the copper in the windings remains and this resistance has a relatively low value such as approximately 10 ohms.

Since the impedance of the windings in the generating means formed by the magnetic amplifier falls to a negligible value upon the saturation of both cores in the amplifier, there is essentially no voltage between the base and emitter of the transistors 86 and 88. This essentially stops the movement of holes toward the base of the conductive transistor and effectively stops the flow of holes past the base to the collector so as to cut off the flow of all current. The flow of current through the conductive transistor is almost instantaneously interrupted since the cores in the magnetic amplifier change almost instantaneously from an unsaturated to a saturated state.

The amplifier shown in Figure 1 and described above is also advantageous for other reasons. As may be seen in Figure 3, and on an amplified scale in Figure 3*f* for the output signal 126, the output signal from each of the magnetic amplifiers in Figure 1 follows the line voltage from the source 36. Since the output signal from the magnetic amplifier may occur after the peak amplitude of line voltage has been reached, the output signal may have a declining amplitude as indicated at 136 in Figure 3*f*.

In Figure 7, current vs. voltage characteristics are shown for a typical transistor such as the transistors 86 and 88 in Figure 1. Different values of the current between the collector and the emitter in Figure 1 are represented along the horizontal axis of the curves shown in Figure 7 and are designated as "I*c*." Along the vertical axis, different values of the voltage between the collector and the emitter are shown and are designated as "V*c*." As will be seen, different relationships between the collector current and the collector-to-emitter voltage are shown in solid lines in Figure 7. Curves are shown in broken lines in Figure 7 to indicate the positions on the solid curves for different values of current between emitter and base, such current being designated as "I*b*."

Since the amplified current is represented as "I*c*," it is desirable to have this current at as high a level as possible. However, it is desirable to have the product "V*c*I*c*" as low as possible since this product represents the power dissipated in the transistor. For this reason, the value of "V*c*" should be maintained at as low a value as possible while current is flowing in order to maintain power losses at a minimum level. The desirability of maintaining power losses at a minimum level has been discussed in detail previously.

Figure 3F:
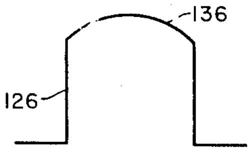

When an output signal such as the signal 126 in Figures 3*e* and 3*f* is first produced in one of the magnetic amplifiers, the amplitude of the signal is initially at a relatively high value. The high amplitude of the signal from the magnetic amplifiers causes a relatively large current "I*c*" to flow between the emitter and collector of one of the transistors 86 and 88. This current may have a magnitude such as that indicated at 138 in Figure 7. For this value of current, the voltage "V*c*" is relatively low so that the power losses in the transistor are also low.

As the amplitude of the signal from the magnetic amplifier decreases as indicated at 136 in Figure 3*f*, the current "I*b*" between the emitter and base of the conductive transistor would also tend to decrease. The would ordinarily cause the current "I*c*" between the collector and emitter of the transistor to change from the value 138 to a value 140 in Figure 7. However, as will be seen, the voltage "V*c*" at the position 140 is considerably greater than the voltage at the position 138. For this reason, the power losses in the transistor would tend to increase as the amplitude of the signal from the magnetic amplifier decreased and even though the current "I*c*" correspondingly decreased.

By applying a rectified alternating voltage to the emitters of the transistors 86 and 88, any disadvantages of having a signal with a decreasing amplitude are considerably reduced if not substantially eliminated. This results from the fact that the voltage applied to the emitter of the conductive transistor tends to follow the voltage applied to the base of the transistor. Because of this, instead of shifting from the position 138 to the position 140 in Figure 7 as the amplitude of the signal decreases, the shift is made from the position 138 to a position 142. As will be seen, a low voltage "V*c*" exists at the position 142 such that the power losses in the transistor remain low.

In this way, the transistor operates in the flat portions of the curves shown in broken lines in Figure 7. In these flat portions, small changes in the current "I*b*" do not produce large changes in the voltage "V*c*." This tends to produce a relatively stable operation of the transistor. It also tends to minimize power losses in the transistor since the voltage "V*c*" remains low at all times.

The amplifier shown in Figure 1 is advantageous for another reason. This results from the fact that the input windings of the magnetic amplifier such as the windings 26 and 28 are not tied to any reference potential such as ground. Because of this, the amplifier can receive as an input signal the difference between two signals, each of which is not tied to any reference potential such as ground. In this way, the amplifier shown in Figure 1 can amplify input signals upon which it might otherwise not be able to operate if the inputs to the amplifier were not floating. The usefulness of the amplifier shown in Figure 1 is further enhanced by the fact that neither of the output windings in the magnetic amplifier such as the windings 30 and 32 has to be tied to a reference potential such as ground.

The amplifier shown in Figure 1 has another advantage. It utilizes a pair of transistors in which the emitters are connected to each other. By connecting the emitters together, random variations in the potential on one of the emitters are transferred to the other emitter. Because of this, the random variations in potential do not affect appreciably the output potential across the winding 90. In this way, the transistors operate as if their emitters were at a fixed reference potential such as ground.

It should be appreciated that signals can be applied to the transistors such as the transistors 86 and 88 from other generating means or stages than magnetic amplifiers. The signals can be applied from other generating means or stages than magnetic amplifiers provided that these stages are able to produce substantially rectangular pulses to modulate the transistors with respect to time in a manner similar to the modulation provided by the magnetic amplifiers. However, it should also be appreciated that the magnetic amplifiers offer certain advantages which have been described above in detail. This is especially true of the "ultra fast" magnetic amplifiers such as the magnetic amplifiers shown in Figure 1. These magnetic amplifiers have been described in detail and claimed in Patent 2,827,603 issued to Joseph A. Fingerett and Frank A. Hill.

It should be appreciated that the amount of power introduced to the load such as the winding 90 through the transistors such as the transistors 86 and 88 is dependent upon the time required for the first of the two cores in the magnetic amplifier to saturate in each half cycle of line voltage. This results from the fact that the load receives on an amplified basis the energy stored in the unsaturated core after the first core has saturated. The amount of time that power is delivered to the load is also dependent upon the time that the first core in the magnetic amplifier saturates. This is true because it determines the time required for the unsaturated core in the magnetic amplifier to saturate in each half cycle of line voltage after the first core in the magnetic amplifier has saturated in the half cycle. In this way, the characteristics of the magnetic amplifier determine the duty cycle of the transistors such as the transistors 86 and 88. The term "duty cycle" as used here indicates the ratio between the time that current is flowing to the load in each cycle of line voltage with respect to the time required for a cycle of line voltage to occur.

Figure 8:
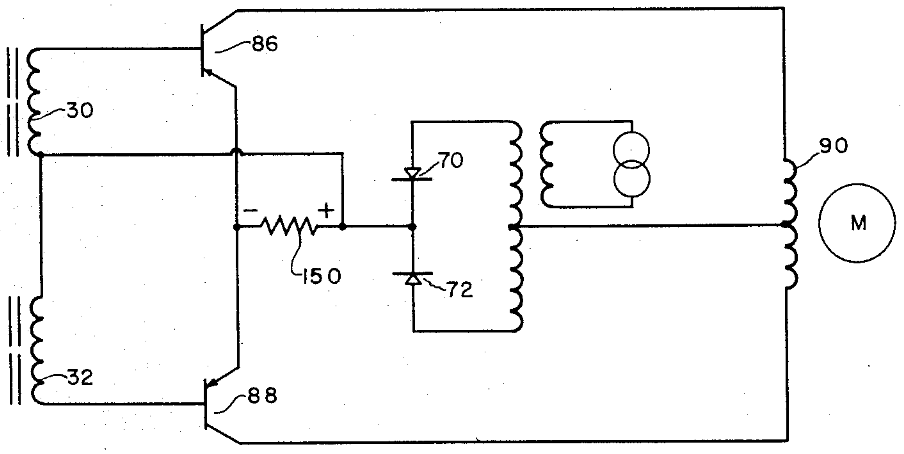

The embodiment shown in Figure 8 is similar to the embodiment shown in Figure 1 except for the inclusion of an additional resistance 150. This resistance is connected at one end to the cathodes of the diodes 70 and 72 and to the lower terminal of the output winding 30 and the upper terminal of the output winding 32. Connections are made from the other end of the resistance 150 to the emitters of the transistors 86 and 88.

As has been previously described in connection with the embodiment shown in Figure 1, only one of the transistors 86 and 88 is able to conduct in each half cycle of line voltage. When the transistor 86 conducts, current flows downwardly in Figures 1 and 8 through the winding 90. This current causes a positive potential to be produced on the upper terminal of the winding 90 relative to the potential on the center-tapped terminal. The current also causes a voltage to be induced in the lower half of the winding 90 such that a negative potential appears on the lower terminal of the winding.

Since the negative potential on the lower terminal of the winding 90 is introduced to the collector of the transistor 88, it would tend to produce a flow of current between the emitter and collector of the transistor. Such a flow of current is undesirable because of the requirement that the transistor remain non-conductive for optimum operation. The flow of current is also undesirable because the high potential on the collector tends to produce large power dissipation in the transistor.

By including the resistance 150, a current flow is obtained through the resistance in each half cycle of line voltage. This current flow is in a direction to produce a positive potential on the right terminal of the resistance 150 in Figure 8 relative to the potential on the left terminal of the resistance. The positive potential on the right terminal of the resistance 150 is applied through the winding 32 to the base of the transistor 88. This potential causes the base of the transistor 88 to serve as a barrier for interrupting any current flow which might be obtained between the emitter and the collector of the transistor because of the negative potential on the collector of the transistor.

In this way, any current flow in the transistor 88 occurs between the emitter and the base of the transistor during the half cycles in which amplified signal current flows between the emitter and collector of the transistor 86. A current flow between the emitter and the base of a transistor is more desirable from a thermal standpoint than a current flow between the emitter and the collector of the transistor. This results from the fact that the impedance between the emitter and base of the transistor is considerably less than the impedance between the emitter and collector of the transistor. Since the impedance between the emitter and base of the transistor is low, the power dissipated in the transistor is correspondingly low.

In like manner, the transistor 86 should remain cut off in the half cycles that the transistor 88 is conducting. When the transistor 88 conducts, current flows through the winding 90 in an upwardly direction in Figure 8 and causes a negative potential to be produced on the upper terminal of the winding. This potential would produce an undesirable flow of current through the transistor 86. Because of the action of the resistance 150, however, any current flow in the transistor 86 occurs between the emitter and base of the transistor. In this way, dissipation of power in the transistor 86 is minimized in the alternate half cycles.

Figure 9:
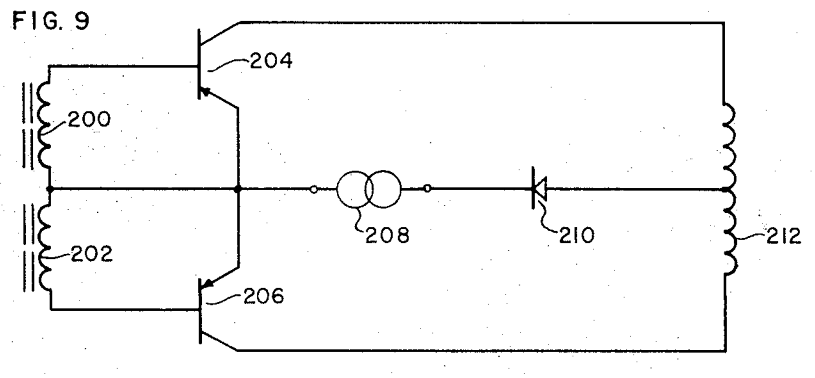

Another embodiment of the invention is shown in Figure 9. This embodiment includes input stages similar to those shown in Figure 1. For this reason, such components as the transistor 76, the input windings 26 and 28 and the line windings 18, 20, 22 and 24 are not included in Figure 9. The circuit shown in Figure 9 includes a pair of output windings 200 and 202 respectively corresponding to the output windings 30 and 32 in Figure 1. The lower terminal of the winding 200 and the upper terminal of the winding 202 in Figure 9 are connected to the emitters of a pair of transistors 204 and 206 respectively corresponding to the transistors 86 and 88 in Figure 1. Connections are made from the upper terminal of the winding 200 in Figure 9 to the base of the transistor 204 and from the lower terminal of the winding 202 to the base of the transistor 206.

In addition to being connected to the windings 200 and 202, the emitters of the transistors 204 and 206 have a common connection with one terminal of a source 208 of line voltage corresponding to the source 36 in Figure 1. Instead of directly including the source 208 in the circuit, the secondary winding of a transformer could be included in a manner similar to the secondary winding 42 in Figure 1. The other terminal of the source 208 has a common connection with the cathode of a diode 210, the plate of which is connected to the center-tap of a suitable load such as a winding 212 corresponding to the winding 90 in Figure 1. The upper terminal of the winding 212 in Figure 9 is connected to the collector of the transistor 204, and the lower terminal of the winding is connected to the collector of the transistor 206.

When one of the cores associated with the winding 200 saturates, a signal is induced in the winding by the flux in the other core and is introduced to the transistor 204 to produce a flow of current between the emitter and base of the transistor. This current in turn causes an amplified current to flow between the collector and emitter of the transistor 204. The current is able to flow only in the alternating half cycles of voltage in which a positive voltage is produced on the left terminal of the source in Figure 9. In these half cycles, current flows through a circuit including the source 208, the emitter and the collector of the transistor 204, the upper half of the load 212 and the diode 210. The current continues until the saturation of the second core magnetically associated with the winding 200.

In like manner, an input signal is introduced from the winding 202 to the transistor 206 upon the saturation of one of the cores magnetically coupled to the winding. This signal produces a flow of current between the emitter and the base of the transistor 206 and an amplified flow of current between the emitter and the collector of the transistor. The current is able to flow only in the alternating half cycles of line voltage in which a positive potential is produced on the left terminal of the source 208 in Figure 9. The current flows through a circuit including the source 208, the emitter and collector of the transistor 206, the lower half of the load 212 and the diode 210.

The amplifier shown in Figure 9 is advantageous for certain reasons. These advantages result largely from the simplicity of the circuitry and from the minimum number of components required to obtain proper operation. For example, the amplifier shown in Figure 9 does not require a transformer having a center-tapped secondary winding. Furthermore, the amplifier requires only the single diode 210 instead of two or more diodes. The amplifier is also advantageous since the emitters in the transistors have a common connection.

Figure 10:
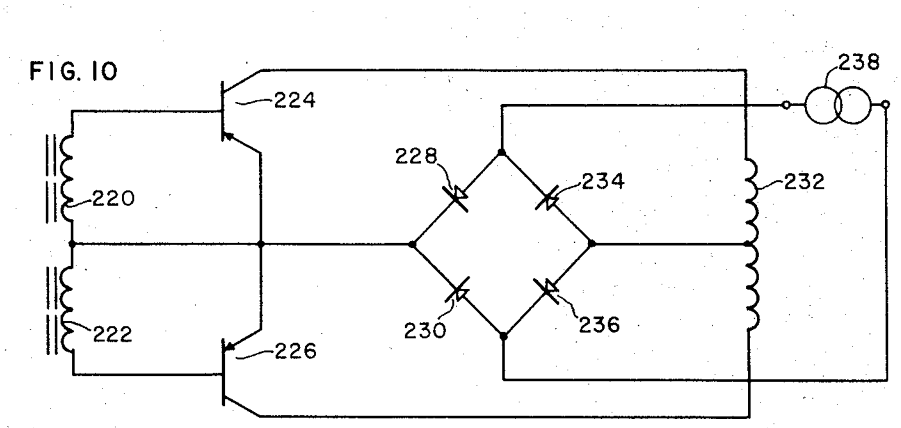
Figure 11:
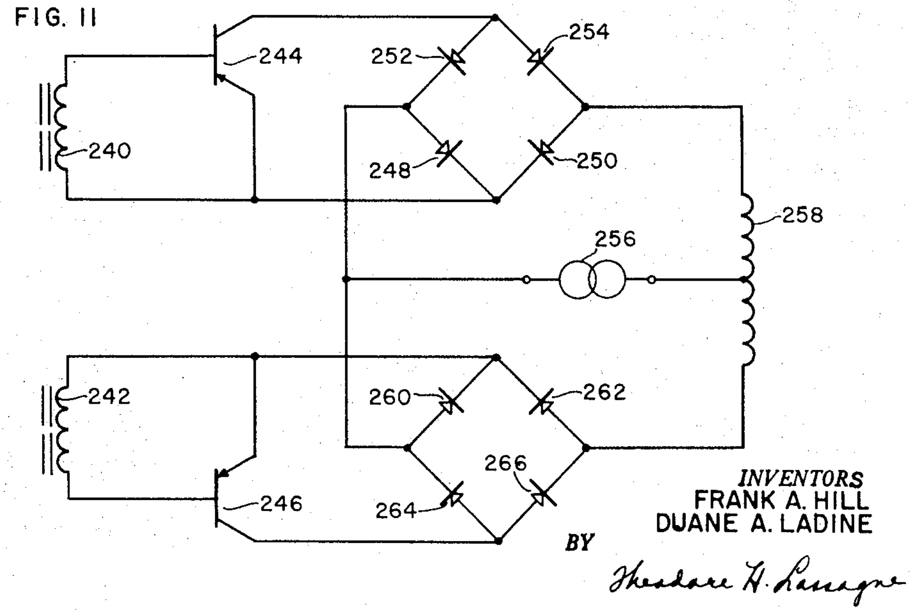

In the embodiment shown in Figure 10, only the output stages are illustrated since the input stages can be similar to those shown in Figure 1 and described fully above. The embodiment shown in Figure 10 includes a pair of output windings 220 and 222 corresponding to the windings 30 and 32 in Figure 1. The upper terminal of the winding 220 in Figure 10 is connected to the base of a transistor 224 corresponding to the transistor 86 in Figure 1. Similarly, the lower terminal of the winding 222 is connected to the base of a transistor 226 corresponding to the transistor 88 in Figure 1. The lower terminal of the winding 220 and the upper terminal of the winding 222 have common connections with the emitters of the transistors 224 and 226 and with the cathodes of a pair of diodes 228 and 230.

Connections are respectively made from the collectors of the transistors 224 and 226 to the upper and lower terminals of a load such as a winding 232 corresponding to the winding 90 in Figure 1. The winding 232 has a center-tapped terminal which is connected to the plates of a pair of diodes 234 and 236. Alternating line voltage is introduced to the plate of the diode 228 and the cathode of the diode 234 from the left terminal of a source 238 corresponding to the source 36 in Figure 1. The plate of the diode 230 and the cathode of the diode 236 receive potentials from the right terminal of the source 238 in Figure 10.

When one of the cores magnetically coupled to the winding 220 saturates, the winding produces a signal which is introduced to the transistor 224 to produce a flow of current through the transistor. In the positive half cycles of line voltage as represented by a relatively high voltage on the left output terminal of the source 238, current flows through a circuit including the source, the diode 228, the emitter and collector of the transistor 224, the upper half of the winding 232 and the diode 236. In the negative half cycles of line voltage, current flows through a circuit including the source 238, the diode 230, the emitter and collector of the transistor 224, the upper half of the load 232 and the diode 234. In this way, current flows in a downwardly direction in Figure 10 through the upper half of the winding 232 in each half cycle of line voltage.

Upon the saturation of one of the cores magnetically associated with the winding 222, a signal is introduced from the winding to the transistor 226 to produce a flow of current through the transistor. When the line voltage has a positive polarity as represented by a relatively high voltage on the left output terminal of the source 238, current flows through a circuit including the source, the diode 228, the emitter and collector of the transistor 226, the lower half of the winding 232 and the diode 236. When the line voltage is negative, current flows through a circuit including the source 238, the diode 230, the emitter and collector of the transistor 226, the lower half of the winding 232 and the diode 234. In this way, current flows upwardly through the winding 232 in each half cycle of line voltage.

The embodiment shown in Figure 10 has certain advantages. It produces an output signal having the same polarity as the input signal. Furthermore it requires no center-tapped line supply such as the center-tapped secondary winding 42 in Figure 1. The embodiment is also advantageous in that the emitters of the transistors 224 and 226 have a common connection. Because of their common connection, variations in the operation of the transistors with respect to each other are minimized in a manner similar to that described fully above.

The embodiment shown in Figure 10 utilizes one bridge circuit formed by the diodes 228, 230, 234 and 236. This bridge circuit passes in amplified form the signals induced in each of the windings 220 and 222. Two bridge circuits are included in the embodiment shown in Figure 11, each bridge circuit being adapted to pass in amplified form the signals induced in a different one of the output windings. The embodiment shown in Figure 11 includes a pair of output windings 240 and 242 corresponding to the windings 30 and 32 in Figure 1. The winding 240 is connected between the base and emitter of a transistor 244 corresponding to the transistor 86 in Figure 1. Similarly, connections are made from the terminals of the winding 242 to the base and emitter of a transistor 246 corresponding to the transistor 88 in Figure 1.

In additional to being connected to the winding 240, the emitter of the transistor 244 has a common connection with the cathodes of diodes 248 and 250. The collector of the transistor 244 is connected to the plates of diodes 252 and 254 forming a first bridge circuit with the diodes 248 and 250. The plate of the diode 248 and the cathode of the diode 252 are adapted to receive alternating line voltage from the left terminal in Figure 11 of a suitable source 256 corresponding to the source 36 in Figure 1. The right terminal of the source 256 in Figure 1 has a common connection with the center-tap of a suitable load such as a winding 258 corresponding to the winding 90 in Figure 1. Connections are made from the upper terminal of the winding 258 to the plate of the diode 250 and the cathode of the diode 254.

In like manner, the emitter of the transistor 246 is connected to the cathodes of diodes 260 and 262 as well as to the winding 242, and the collector of the transistor is connected to the plates of diodes 264 and 266. The diodes 260, 262, 264 and 266 are included in a second bridge circuit. The plate of the diode 260 and the cathode of the diode 264 receive the potential on the left terminal of the source 256 in Figure 11. The plate of the diode 262 and the cathode of the diode 266 have a common connection with the lower terminal of the winding 258 in Figure 11.

When one of the cores associated with the winding 240 saturates, a signal is produced by the winding 240 and is introduced to the transistor 244 to produce a flow of current through the transistor. For positive half cycles of line voltage from the source 256, current flows through a circuit including the source, the diode 248, the emitter and collector of the transistor 244, the diode 254 and the upper half of the load winding 258. In the next half cycles of line voltage, the flow of current takes place through a circuit including the source 256, the upper half of the winding 258, the diode 250, the emitter and collector of the transistor 244 and the diode 252.

The saturation of one of the two cores associated with the winding 242 causes a signal to be produced for introduction to the transistor 246. This signal produces a flow of current through the transistor. In alternating half cycles of line voltage from the source 256, current flows through a circuit including the source, the diode 260, the emitter and collector of the transistor 246, the diode 266 and the lower half of the winding 258. In the other half cycles, the winding 258 receives a flow of current through a circuit including the source 256, the lower half of the winding, the diode 262, the emitter and collector of the transistor 246 and the diode 264.

As will be seen, for a direct input signal, current flows in one direction through the winding 258 in alternate half cycles of line voltage from the source 256 and in the opposite direction in the other half cycles of line voltage. This causes a direct input signal to be converted and amplified into an alternating output signal. In like manner, it may be seen from an analysis of the circuit operation that an alternating input signal is converted and amplified into a direct output signal. The amplification is obtained without requiring that the supply of alternating voltage be center-tapped in a manner similar to the secondary winding 42 in Figure 1.

Figure 12:
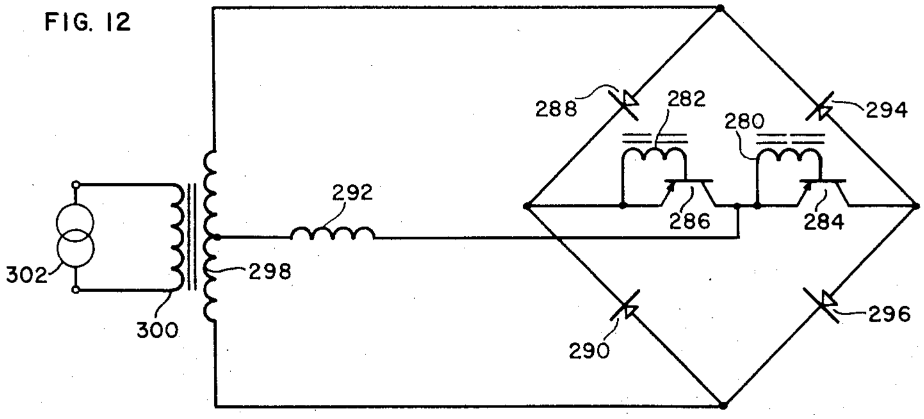

In Figure 12, another type of bridge arrangement in the output stage is shown. The arrangement shown in Figure 12 includes a pair of output windings 280 and 282 corresponding to the windings 30 and 32 in Figure 1. The winding 280 is connected between the base and emitter of a transistor 284 corresponding to the transistor 86 in Figure 1, and the winding 282 is connected between the base and emitter of a transistor 286 corresponding to the transistor 88 in Figure 1.

In addition to being connected to the winding 282, the emitter of the transistor 286 has a common connection with the cathodes of a pair of diodes 288 and 290. Connections are made from the collector of the transistor 286 to the emitter of the transistor 284 and to one terminal of a suitable load such as a winding 292 corresponding to the winding 90 in Figure 1. The collector of the transistor 284 is connected to the plates of a pair of diodes 294 and 296.

The plate of the diode 288 and the cathode of the diode 294 have alternating voltage applied to them from one terminal of a secondary winding 298. In like manner, the plate of the diode 290 and the cathode of the diode 296 receive alternating voltage from the other terminal of the secondary winding 298. The secondary winding 298 also has a center tap which is connected to the winding 292. The secondary winding 298 is included in a transformer with a primary winding 300 adapted to receive alternating voltage from a source 302.

Upon the saturation of one of the cores magnetically coupled to the winding 280, a signal is induced in the winding for producing a flow of current through the transistor 284. The conduction of the transistor 284 causes current to flow in alternate half cycles through a circuit including the winding 292, the emitter and collector of the transistor 284, the diode 294 and the upper half of the secondary winding 298 in Figure 12. Current flows through the above circuit in the alternate half cycles since the voltage on the lower terminal of the secondary winding 298 in Figure 12 is more positive than the voltage on the upper terminal of the winding. In the other half cycles of line voltage, the flow of current takes place through a circuit which includes the load 292, the emitter and collector of the transistor 284, the diode 296, and the bottom half of the secondary winding 298. The current flows through this circuit since the voltage on the upper terminal of the secondary winding 298 in Figure 12 is more positive than the voltage on the lower terminal of the winding. As will be seen, the current flows towards the right in Figure 12 through the winding 292 in the successive half cycles. In this way, a direct input signal causes an amplified direct output signal to be produced.

The output winding 282 produces a flow of current through the transistor 286 when the input signal has an opposite polarity to that producing a flow of current through the transistor 284. When the transistor 286 becomes conductive, current flows in alternate half cycles through a circuit including the diode 290, the emitter and collector of the transistor 286, the load 292 and the lower half of the secondary winding 298. In the other half cycles of line voltage, the flow of current takes place through a circuit including the diode 288, the emitter and collector of the transistor 286, the winding 292 and the lower half of the winding 298. As will be seen, the current flows toward the left in Figure 10 through the winding 292 in successive half cycles. In this way, an amplified direct output voltage is produced upon the introduction of a direct input voltage.

It may be seen from the above discussion that an alternating output signal is produced when an alternating input signal is introduced to the embodiment shown in Figure 12. Since a direct output signal is also produced upon the introduction of a direct input signal, the output signal has the same characteristics as the input signal. The output signals are produced without any requirement for a center-tapped load. Since the output current flows through the load winding 292 instead of only half the winding, approximately one half of the power losses are eliminated in the winding. When the winding 292 forms part of a motor, the increased production of power in the winding produces an increased efficiency in the operation of the motor.

Figure 13:
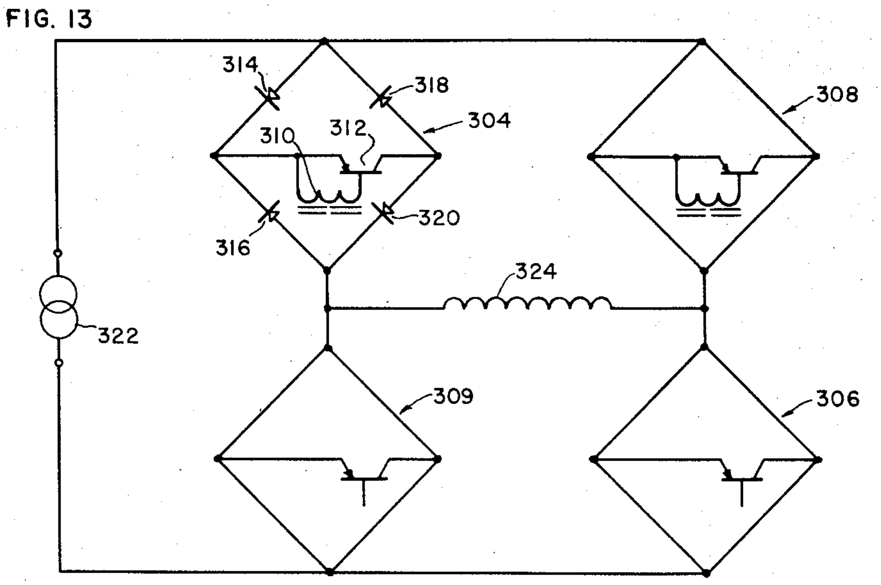

The embodiment shown in Figure 13 includes a plurality of bridges somewhat similar to the bridge shown in Figure 12. These bridges are generally indicated at 304, 306, 308 and 309. For example, the bridge 304 includes an output winding 310 corresponding to the winding 30 in Figure 1. The winding is connected between the base and emitter of a transistor 312 corresponding to the transistor 86 in Figure 1. The emitter of the transistor 312 has a common connection with the cathodes of a pair of diodes 314 and 316 as well as with one terminal of the winding 310. A connection is made from the collector of the transistor 312 to the plates of a pair of diodes 318 and 320, which are included in the bridge 304 with the diodes 314 and 316.

One terminal of a source 322 of alternating voltage is connected to a terminal in the bridge 304 defined by a common connection between the plate of the diode 314 and the cathode of the diode 318 and is also connected to a corresponding terminal in the bridge 308. The potential on the other terminal of the source 322 is applied to the terminals of the bridges 306 and 309 corresponding to that formed in the bridge 304 by a common connection between the plate of the diode 316 and the cathode of the diode 320.

A load such as a winding 324 is connected at one end to the terminal in the bridge 304 defined by the common connection between the plate of the diode 316 and the cathode of the diode 320 and at the other end is connected to the corresponding terminal in the bridge 308. The winding 324 is also connected between corresponding terminals of the bridges 306 and 309. These terminals correspond to that formed in the bridge 304 by a common connection between the plate of the diode 314 and the cathode of the diode 318.

The winding 310 in the bridge 304 and the corresponding winding in the bridge 306 are connected in a similar manner so that one of the cores associated with each winding will saturate at substantially the same time in the half cycles. Upon the saturation of one of the cores magnetically coupled to the winding 310 and one of the cores magnetically coupled to the corresponding winding in the bridge 306, the transistor 312 and the correspondinging transistor in the bridge 306 become conductive.

Similarly, the output windings included in the bridges 308 and 309 are connected so that one of the cores associated with each winding will saturate at the same time in the half cycles. This causes the transistors included in the bridges 308 and 309 to become conductive at substantially the same instant of time in the half cycles.

Consideration will first be given to an input signal of a polarity for producing a temporal separation in the saturation of the cores associated with the winding 310 in the bridge 304 and the cores associated with the winding in the bridge 306. When such a temporal separation of core saturations is produced, current flows in alternate half cycles through a circuit including the source 322, the diode 314, the emitter and collector of the transistor 312, the diode 320, the winding 324 and a path in the bridge 306 corresponding to the path in the bridge 304. In the other half cycles current flows through the bridge 306, the winding 324 and the bridge 304. The flow of current through the bridge 304 takes place through the diode 316, the emitter and collector of the transistor 312 and the diode 318, and the flow of current through the bridge 306 occurs through a path similar to that described for the bridge 304. As will be seen in alternating half cycles the current flows towards the right through the winding 324 in Figure 13 and in the other half cycles the current flows towards the left. This causes a direct input signal to be converted to an alternating output signal in the winding 324.

In like manner, it can be shown that a direct input signal of an opposite polarity produces a flow of current through a circuit including the bridge 308, the load 324 and the bridge 309. The current flows in one direction through the winding 324 in Figure 10 in alternate half cycles and in the other direction through the winding in the other half cycles. In this way, the direct input signal is converted into an alternating output signal in the winding 324.

It may be seen from the above discussion that an alternating input signal is converted into a direct output signal in the winding 324. In alternate half cycles, the current flows through the bridges 304 and 306 and the winding 324 and in the other half cycles the current flows through the bridges 308 and 309 and the winding 324. The current flows through the winding in the same direction in successive half cycles.

The embodiment shown in Figure 13 has certain advantages. It does not require a center-tapped power supply such as the secondary winding 42 in Figure 1, and it also does not require a center-tapped load such as the winding 90 in Figure 1. Because of this, a maximum amplitude of line voltage can be introduced and a maximum amount of power can be produced in the load such as the winding 324. The operation of the load is also more efficient because all of the copper in the load is always in the circuit.

Figure 14:
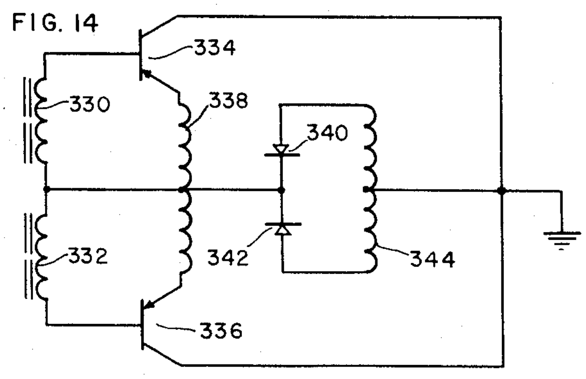

The embodiment shown in Figure 14 operates in a manner similar to a cathode follower. It includes a pair of output windings 330 and 332 corresponding to the output windings 30 and 32 in Figure 1. Connections are made from the upper terminal of the winding 330 in Figure 14 to the base of a transistor 334 corresponding to the transistor 86 in Figure 1 and from the lower terminal of the winding 332 to the base of a transistor 336 corresponding to the transistor 88 in Figure 1. The lower terminal of the winding 330 and the upper terminal of the winding 332 in Figure 14 have a common connection with the center tap of a suitable load such as a winding 338 corresponding to the winding 90 in Figure 1. The center tap of the winding 338 is also connected to the cathodes of a pair of diodes 340 and 342.

The emitters of the transistor 334 and 336 are connected to the opposite terminals of the winding 338. The collectors of the transistors 334 and 336 are grounded, as is the center tap of a secondary winding 344 corresponding to the winding 42 in Figure 1. The voltages on the opposite terminals of the secondary winding 344 are respectively applied to the plates of the diodes 340 and 342.

Upon the saturation of one of the cores associated with the winding 330, a signal is induced in the winding by the other core associated with the winding. This signal is applied between the base and emitter of the transistor 334 to produce a flow of current through the transistor. The current flows through a circuit including the upper half of the winding 338, the emitter and base of the transistor 334 and the winding 330.

The flow of current between the emitter and base of the transistor 334 produces an increased flow of current between the emitter and collector of the transistor. The increased flow of current through the transistor 334 is obtained through a circuit including the upper half of the winding 344, the diode 340, the upper half of the winding 338 and the emitter and collector of the transistor. As will be seen, the upper half of the winding 338 receives both the current flowing between the emitter and the base of the transistor 334 and the current flowing between the emitter and collector of the transistor.

In like manner, the saturation of one of the cores associated with the winding 332 causes the transistor 336 to become conductive. Current then flows between the emitter and base of the transistor 336 and between the emitter and collector of the transistor. All of the current flowing through the transistor also flows through the lower half of the winding 338. The current flows downwardly in Figure 14 through the lower half of the winding 338 in successive half cycles of line voltage for an input signal of a constant polarity. In this way, the embodiment shown in Figure 14 produces a direct output signal upon the introduction of a direct input signal. It may also be seen that the embodiment produces an alternating output signal when an alternating input signal is applied to the amplifier.

The embodiment shown in Figure 14 is advantageous for certain reasons. One advantage results from grounding the collector of the transistors 334 and 336. This is advantageous since the shell of the transistor is also grounded because of its connection to the collector in the normal construction of the transistor. Another possible advantage is the flow of all of the transistor current through the winding 338. This may be a possible advantage under certain circumstances even though the power gain is less than that obtained from some of the embodiments discussed above such as the embodiment shown in Figure 1.

There is thus provided circuits including semi-conductors such as transistors for amplifying time-modulated input signals. The input signals are time-modulated so as to have substantially rectangular characteristics. Such signals are preferably obtained by the use of magnetic amplifiers and especially by "ultra-fast" magnetic amplifiers similar to those shown in Figure 1. By using rectangular signals to modulate the transistors with respect to time, the power dissipation in the transistors is maintained at a low level. In this way, a high efficiency in the operation of the transistors is obtained over long periods of time.

We claim:

1. In combination, a semi-conductor having an emitter, a base and a collector, means for providing input signals having sharp rising and trailing characteristics, means responsive to the input signals and coupled to the semi-conductor for applying the input signals between the emitter and the base of the semi-conductor to produce a signal between these members and an amplified output signal between the emitter and the collector of the semi-conductor, and means in the input signal means for producing an instantaneous interruption in the output signal in the semi-conductor at the end of each input signal.

2. In combination, a semi-conductor having an emitter, a base and a collector, means for providing an alternating line voltage, means coupled to the voltage means for providing in the half cycles of line voltage input signals having relatively sharp leading and trailing characteristics, means responsive to the input signals and coupled to the semi-conductor for introducing the input signals between the emitter and the base of the semi-conductor to produce an amplified output signal in the semi-conductor during the occurrence of the input signals, and means coupled to the voltage means and to the semi-conductor for applying the alternating voltage to the emitter of the semi-conductor on a unidirectional basis with characteristics corresponding to those of the input signal to minimize power losses in the semi-conductor during the production of the output signal.

3. In combination, means for providing an alternating line voltage, means coupled to the voltage means for providing in successive half cycles of the line voltage input signals having a substantially zero amplitude during a first portion of the half cycles and having a steep rising characteristic to a peak amplitude and a steep trailing characteristic to a zero amplitude during a second portion of the half cycles, a semi-conductor having a base, an emitter and a collector, means responsive to the input signals and coupled electrically between the emitter and base of the semi-conductor for applying the input signals between the emitter and the base of the semi-conductor to produce a signal between the emitter and the base and an amplified output signal between the emitter and the collector.

4. In combination, means for providing an alternating line voltage, means responsive to the alternating line voltage for providing in successive half cycles of the line voltage input signals having a substantially zero amplitude during a first portion of the half cycles and having a steep rising characteristic to a peak amplitude and a steep trailing characteristic to a zero amplitude during a second portion of the half cycles, a semi-conductor having a base, an emitter and a collector, means responsive to the input signals and coupled electrically between the base and the emitter of the semi-conductor for applying the input signals between the emitter and the base of the semi-conductor to produce a signal between the base and the emitter and an amplified output signal between the emitter and the collector, and means coupled to the emitter and the collector of the semi-conductor and responsive to the alternating line voltage for varying the voltage applied between the emitter and the collector of the semi-conductor in accordance with the amplitude of the input signals to maintain the power losses in the semi-conductor at a low level.

5. In combination, means for providing an alternating line voltage, means coupled to the voltage means for rectifying the alternating line voltage to produce a unidirectional voltage having in each half cycle of line voltage characteristics approximating those of the alternating line voltage, a semi-conductor having an emitter, a base and a collector, control means for providing control signals, means coupled to the voltage means and to the control means for initially providing relatively high impedances in the successive half cycles of line voltage and for providing low impedances subsequently in the half cycles in accordance with the characteristics of the control signals and for generating input signals upon the occurrence of the low impedances and until the occurrences of a relatively low impedance in the generating means, means responsive to the input signals and coupled to the emitter and the base of the semi-conductor for applying the input signals between the emitter and the base of the semi-conductor to produce an amplified output signal between the emitter and the collector of the semi-conductor until the occurrence of the relatively low impedance in the generating means, and means responsive to the rectified alternating voltage and coupled to the semi-conductor for applying the rectified alternating voltage to the emitter of the semi-conductor with characteristics corresponding to those of the input signals to maintain the voltage between the collector and emitter at a relatively low value during the production of the amplified output signal for the dissipation of a small amount of power in the semi-conductor.

6. In combination, a semi-conductor having an emitter, a base and a collector, means coupled to the semi-conductor for normally applying between the emitter and the base of the semi-conductor a high impedance for maintaining the semi-conductor in a non-conductive state, means for generating an input signal and coupled to the emitter and the base of the semi-conductor for applying a low impedance from the generating means during the generation of the input signal to produce a signal between the emitter and the base of the semi-conductor and an amplified output signal between the emitter and the collector of the semi-conductor, means coupled to the generating means and the semi-conductor for varying the potential applied to the emitter in accordance with the characteristics of the generated signal to maintain the voltage between the emitter and the collector at a low level during the production of the amplified output signal for a control of the power dissipated in the semi-conductor, and means including the generating means and coupled to the semi-conductor for obtaining the production of a low impedance in the generating means at the end of the generated signal for the application of a potential to the base of the semi-conductor corresponding to the potential applied to the emitter to obtain an instantaneous interruption in the production of the amplified output signal in the semi-conductor.

7. In combination, means for providing an alternating line voltage, means for providing an input signal, a magnetic amplifier having a pair of saturable cores and having a plurality of windings coupled to the voltage means and to the signal means for receiving the line voltage and the input signal and for producing in successive half cycles of the line voltage a temporal separation in the saturation of the cores in accordance with the characteristics of the line voltage and the input signal and for producing a signal during the separation in the core saturations, a semi-conductor having a base, an emitter and a collector, a load connected in a circuit with the collector of the semi-conductor, and means including the magnetic amplifier and connected in the circuit with the semi-conductor for applying between the base and the emitter of the semi-conductor the signals from the magnetic amplifier to produce a signal between the emitter and the base and an amplified output signal between the emitter and the collector and across the load.

8. In combination, means for providing an alternating line voltage, means for providing an input signal, a magnetic amplifier coupled to the voltage means and the signal means and having a pair of saturable cores and having a plurality of windings for receiving the line voltage and the input signal and for providing in successive half cycles of the line voltage a temporal separation in the saturation of the cores in accordance with the characteristics of the line voltage and the input signal and a saturation of both cores during the half cycles of line voltage and for producing a control signal during the separation in the core saturations, a semi-conductor having a base, an emitter and a collector, a load, at least one particular winding in the magnetic amplifier being connected in a circuit with the semi-conductor for applying the control signal between the base and the emitter of the semi-conductor to produce a signal between the base and the emitter and an amplified output signal between the emitter and the collector and for providing a low impedance to the semi-conductor upon the saturation of both cores in the magnetic amplifier, and means including an impedance connected in a circuit with the line voltage means, the semi-conductors and the load for obtaining a flow of current through the impedance and the load in accordance with the amplified output signal and for applying voltages between the emitter and base upon the occurrence of the low impedance in the particular winding to cut off the output signal in the semi-conductor.

9. In combination, means for providing an alternating line voltage, means for providing an input signal, a magnetic amplifier coupled to the voltage means and to the signal means and having a pair of saturable cores and a plurality of windings for receiving the alternating line voltage and the input signal to produce a saturation of both cores in each half cycle of line voltage and a saturation of one core before the other core in accordance with the introduction of the input signal and to produce a signal from the magnetic amplifier during the saturation of only one of the cores and to produce a low impedance in the amplifier upon the saturation of both of the cores, a semi-conductor having a base, an emitter and a collector, a load, means including the magnetic amplifier and the semi-conductor connected in a circuit for applying the signal from the magnetic amplifier between the emitter and the base of the semi-conductor to produce a signal in the semi-conductor and an amplified output signal between the collector and emitter of the semi-conductor and across the load, and means including unidirectional means connected in a circuit with the voltage means and the magnetic amplifier and the load for rectifying the alternating line voltage into a unidirectional voltage having characteristics corresponding to those of the signal from the magnetic amplifier and for applying the unidirectional voltage between the collector and emitter of the semi-conductor to maintain the voltage between the collector and the emitter at a low level during the production of the amplified output signal to control the power losses in the semi-conductor.

10. In combination, magnetic amplifiers including first and second pairs of saturable cores, means for providing an alternating line current and connected in a circuit with the magnetic amplifiers for introducing energy to the cores to produce core saturations initially in one direction and then in an opposite direction in successive half cycles of the line current, means connected in a circuit with the magnetic amplifiers for introducing signal energy differentially to the cores in each pair relative to the introduction to the cores of energy from the alternating line current to produce a temporal separation in the saturations of the core in each pair in each half cycle of alternating line current, a pair of semi-conductors, means coupled to the semi-conductors and included in the magnetic amplifiers for biasing the semi-conductors to prevent the flow of current through the semi-conductors, each of the semi-conductors being connected to the magnetic amplifiers for control in accordance with the magnetic level in a different pair of the cores to become conductive upon an initial saturation of a particular one of the cores in the pair and until the saturation of the other core in the pair in alternate half cycles of the alternating line current, and an output circuit including a load and the semi-conductors and the magnetic amplifiers for producing an output voltage across the load during the flow of current through the semi-conductor and of a polarity dependent upon the particular semi-conductor receiving the current flow.

11. In combination, a magnetic amplifier including a pair of saturable cores having substantially rectangular hysteresis characteristics, the magnetic amplifier including a pair of line windings each disposed on a different one of the cores, the magnetic amplifier also including a pair of input windings each disposed on a different one of the cores, the magnetic amplifier also including a pair of output windings each disposed on a different one of the cores, cyclically operable means including means connected in a circuit with the line windings of the magnetic amplifier for introducing line voltage to the line windings to produce saturating flux first of one polarity and then of an opposite polarity in successive half cycles, means connected in a circuit with the input windings of the magnetic amplifier for introducing signals to the input windings relative to the introduction of voltage to the line windings to produce a saturation of one of the cores before the other core in successive half cycles of line voltage and in accordance with the characteristics of the input signals, a semi-conductor, means including the output windings in the magnetic amplifier and coupled to the semi-conductor for biasing the semi-conductor with voltage to inhibit the flow of current through the semi-conductor before the saturation of either of the cores in the semi-conductor and for introducing signals to the semi-conductor during the saturation of only one of the cores in the magnetic amplifier to produce a flow of current through the semi-conductor upon the saturation of one of the cores in successive half cycles and until the saturation of the other core in the half cycles, and an output circuit including the output windings, the semi-conductor and a load for producing an amplified output across the load during the flow of current through the semi-conductor.

12. In combination, first and second semi-conductors each having a base, an emitter and collector, means for providing an alternating line voltage, means for providing an input signal, means connected in a circuit with the semi-conductor for initially biasing the semi-conductor against the production of an output signal during the successive half cycles and for generating signals having relatively sharp characteristics during the half cycles in accordance with the introduction of the input signals and for subsequently producing a relatively low impedance in the generating means during the half cycles to interrupt the generation of the signals, means included in the generating means and connected in a circuit with the semi-conductors for introducing the signals from the generating means between the base and emitter of a particular one of the semi-conductors in accordance with the polarity of the input signal to produce a signal between the base and the emitter and an amplified output signal between the emitter and the collector the particular semi-conductor and for introducing the low impedance in the generating means to the particular semi-conductor at the end of the generated signal to provide a sharp interruption in the production of the output signal in the particular semi-conductor, and a load connected in a circuit with the semi-conductors and with the generating means to receive the output signal from the particular semi-conductor.

13. In combination, first and second semi-conductors each having a base, an emitter and collector, means for providing an alternating line voltage, means for providing an input signal, means connected in a circuit with the semi-conductors and responsive to the line voltage and the input signal for initially biasing the semi-conductors against conduction during the successive half cycles and for generating signals having relatively sharp characteristics during the half cycles in accordance with the introduction of the input signals and for subsequently producing a relatively low impedance in the generating means during the half cycles to interrupt the generation of the signals, output means included in the generating means and coupled to the semi-conductors for introducing the signals from the generating means between the base and emitter of a particular one of the semi-conductors in accordance with the polarity of the input signal to produce a flow of current between these members and an amplified flow of current between the emitter and the collector of the semi-conductor and for introducing the low impedance in the generating means to the semi-conductor at the end of the generated signal to provide a sharp interruption in the flow of current between the emitter and collector of the particular semi-conductor, a load connected in a circuit with the semi-conductors and with the output means in the generating means to receive the flow of current between the emitter and collector of the particular semi-conductor, and impedance means connected in the circuit with the semi-conductors and the load and the output means in the generating means for producing a voltage upon the flow of current through the first semi-conductor to limit the flow of current through the other semi-conductor.

14. In combination, means for providing an alternating line voltage, means for providing an input signal, a pair of magnetic amplifiers each having a pair of saturable cores, each magnetic amplifier being connected in electrical circuitry with the voltage means and the signal means to produce a temporal separation in the core saturations of a different one of the magnetic amplifiers in successive half cycles of the line voltage and in accordance with the polarity of the input signal and to produce an output signal during the temporal separation in the core saturations, a pair of semi-conductors each having a base, an emitter and a collector and each connected to the magnetic amplifiers to be biased normally against conduction, means including the magnetic amplifiers and the semi-conductors connected in a circuit for introducing the signals from each magnetic amplifier to a different one of the semi-conductors to produce a flow of current between the base and the emitter of the semi-conductor and an amplified flow of current between the emitter and the collector of the semi-conductor, and a load and at least one unidirectional means connected in circuits with the first and second semi-conductors, the voltage means and the magnetic amplifiers to produce output pulses in each half cycle of line voltage upon the provision of an input signal and regardless of the polarity of the input signal.

15. In combination, means for providing an alternating line voltage, means for providing an input signal, a pair of magnetic amplifiers each having a pair of saturable cores, each magnetic amplifier being connected in electrical circuitry with the voltage means and the signal means to produce a temporal separation in the core saturations of a different one of the magnetic amplifiers in accordance with the polarity and characteristics of the input signal and to produce a signal during the temporal separation in the core saturations and to provide a low impedance upon the saturation of both of the cores in the magnetic amplifier, a pair of semi-conductors each having a base, an emitter and a collector and each connected to the magnetic amplifiers to be biased normally against conduction and to introduce the signals from each magnetic amplifier to a particular one of the semi-conductors to produce a flow of current between the base and the emitter of the particular semi-conductor and an amplified flow of current between the emitter and the collector of the particular semi-conductor, a load connected in output circuits with the first and second semi-conductors and with the magnetic amplifiers to produce output pulses in each half cycle of line voltage upon the provision of an input signal and regardless of the polarity of the input signal, and means including an impedance and unidirectional means and the line voltage means included in the output circuits for applying the line voltage to the base of the conductive semi-conductor for an instantaneous interruption in the flow of current through the semi-conductor and the load upon the occurrence of the low impedance in the magnetic amplifier.

16. In combination, means for providing an alternating line voltage, means coupled to the voltage means for rectifying the line voltage to provide a uni-directional voltage having characteristics corresponding to the alternating line voltage, means for providing an input signal, a pair of magnetic amplifiers each having a pair of saturable cores and a plurality of windings and connected in electrical circuitry with the line voltage means and the signal means for receiving the line voltage and the input signal and for producing in successive half cycles of the line voltage a temporal separation in the saturation of the cores in accordance with the characteristics of the line voltage and the input signal and a saturation of both cores during the half cycles of line voltage after the temporal separation in core saturations and for producing during the separation in the core saturations a signal having sharp leading and trailing edges, a pair of semi-conductors each having a base, an emitter and a collector, means including output windings in the magnetic amplifiers for producing a bias between the base and emitter of each semi-conductor to cut off any flow of current through the semi-conductor and for applying the signal from each magnetic amplifier between the emitter and base of a different one of the semi-conductors to produce a flow of current between these members and an amplified flow of current between the emitter and collector of the semi-conductor and to produce a sharp interruption in the flow of current through the semi-conductors upon the saturation of both cores in the magnetic amplifiers, a load connected in a second circuit with the semi-conductors and the output windings to receive the amplifier flow of current in each half cycle of line voltage and of a polarity dependent upon the polarity of the input voltage, and means including unidirectional means and the line voltage means connected in the second circuit for applying the rectified line voltage between the emitter and the collector of the semi-conductors to maintain the voltage between these members at a low value during the flow of current between these members.

17. In combination, a magnetic amplifier having a pair of saturable cores and having a winding disposed on each core, means coupled electrically to the magnetic amplifier for applying cyclic line voltage to the winding to produce a saturation of the cores initially in one direction and then in the other direction, means coupled electrically to the magnetic amplifier for applying signal energy in particular half cycles of the line voltage to the magnetic amplifier to produce a temporal separation in the saturations of the cores in those half cycles and to produce in those half cycles signals having a sharp leading edge and continuing until the saturation of the second core and having a sharp trailing edge upon the saturation of the second core and without any transfer from those half cycles to the next half cycles of memory as represented by signal energy in the cores, a semi-conductor having an emitter, a base and a collector, the emitter and base of the semi-conductor being connected in an electrical circuit with the winding to receive a flow of current between the emitter and the base during the production of the signals by the magnetic amplifier and to produce an amplified flow of current between the emitter and the collector of the semi-conductor during the production of the signals by the magnetic amplifier, and means including a unidirectional member and a load disposed in a circuit with the line voltage means and with the winding in the magnetic amplifier and with the semi-conductor to apply the cyclic voltage in a rectified form between the emitter and the collector of the semi-conductor to minimize the voltage between the emitter and the collector during the amplified flow of current between the emitter and the collector.

18. In combination, means for providing an alternating line voltage, means including unidirectional means connected in a circuit with the line voltage means for rectifying the line voltage to provide a unidirectional voltage having an amplitude variable in accordance with the variations in the amplitude of the alternating voltage, a pair of magnetic amplifiers each having a pair of saturable cores, means including first windings disposed on each pair of cores and included in the magnetic amplifier and connected in electrical circuitry with the line voltage means for producing core saturations in successive alternations and in directions corresponding to the polarity of the voltage alternations, signal means, means including second windings disposed on the cores and included in the magnetic amplifier and connected in electrical circuitry with the signal means for applying in particular alternations signal energy differentially to the cores in each pair relative to the energy applied to the cores by the line voltage to produce a saturation of one of the cores in a pair before the other core in the pair in those alternations in accordance with the polarity of the line voltage and the polarity of the signal energy for the production during the separation in the core saturations of a control signal having sharp leading and trailing characteristics, third windings disposed on each pair of cores and included in the magnetic amplifiers, a pair of semiconductors each having a base, an emitter and a collector and each having the emitter and the base connected to a different one of the third windings to obtain a flow of current between the emitter and the base and an amplified flow of output current between the emitter and collector upon the production of the control signals by the coupled winding and to produce a sharp interruption in the flow of current through the semi-conductors upon the saturation of both cores in one of the magnetic amplifiers, means including a load connected in output circuitry with the unidirectional means and the emitters and collectors of the semi-conductors and with the magnetic amplifiers to receive the output pulses of current in the particular half cycles of line voltage and to prevent any transfer of signal energy in the cores from the particular half cycles to the next half cycles, and means connected in the output circuitry with the semi-conductors, the magnetic amplifiers, the unidirectional means and the load for applying the rectified line voltage between the emitters and collectors of the semi-conductors to obtain a voltage with characteristics corresponding to those of the control signals applied to the semi-conductor and to maintain the voltage between these members at a low value during the flow of current between these members for a minimization of the power dissipation in the semi-conductors.

19. The combination set forth in claim 18 in which the line voltage means is center-tapped and in which each half of the voltage means is connected in the output circuitry to apply the rectified line voltage between the emitter and the collector of a different one of the semi-conductors and in which the load is center-tapped and in which each half of the load is connected in the output circuitry to receive the current flowing between the emitter and collector of a different one of the semi-conductors.

20. The combination set forth in claim 18 in which the line voltage means is center-tapped and in which each half of the voltage means is connected in the output circuitry to apply the rectified line voltage between the emitter and the collector of a different one of the semi-conductors and in which the load is center-tapped and in which each half of the load is connected in the output circuitry to receive the current flowing between the emitter and collector of a different one of the semi-conductors and in which the emitters of the semi-conductors have a common connection and in which a resistance is included in the output circuitry with the load and is connected to the semi-conductors to produce a voltage for biasing each semi-conductor against the flow of any load current during the flow of load current through the other semi-conductor.

21. The combination set forth in claim 18 in which the line voltage means and the load have a common center tap and in which first and second unidirectional means are provided with plates and cathodes and are included in the output circuitry and in which the plates of the first and second unidirectional means are connected to opposite ends of the line voltage means and in which the cathodes of the unidirectional means are connected to one terminal of a resistance and to the first terminal of the third winding in a first one of the magnetic amplifiers and to the second terminal of the third winding in the other magnetic amplifier and in which the second terminal of the resistance is connected to the emitters of the semi-conductors and in which the bases of the semi-conductors are respectively connected to the second terminal of the third winding in the first magnetic amplifier and to the first terminal of the third winding in the first magnetic amplifier and in which the collectors of the semi-conductors are connected to opposite ends of the load.

22. The combination set forth in claim 18 in which the load is center-tapped and in which the collectors of the semi-conductors are connected to the opposite terminals of the load and in which the line voltage means and unidirectional means are connected between the center tap of the load and the emitters of the semi-conductors and in which each of the third windings is connected between the base and the emitter of a different one of the semi-conductors.

23. The combination set forth in claim 18 in which unidirectional means are included in the output circuitry and are provided with a plate and a cathode and in which the load has a center tap connected to the plate of the unidirectional means and in which the collectors of the semi-conductors are connected to the opposite terminals of the load and in which the line voltage means are connected between the cathode of the unidirectional means and the emitters of the semi-conductors and in which the third windings in each magnetic amplifier are connected between the emitter and base of a different one of the semi-conductors.

24. The combination set forth in claim 18 in which the load is center tapped and in which bridge circuitry is included in the output circuitry and is connected to obtain a flow of current through a circuit including the line voltage means, the load, the bridge circuitry and the semi-conductor associated with the magnetic amplifier producing the signal and to obtain such a flow of current through the load regardless of the polarities of the input signal and the line voltage at any instant.

25. The combination set forth in claim 18 in which the load is center tapped and in which a bridge circuit is formed from a plurality of unidirectional members and is connected in the output circuitry and in which a first pair of opposite terminals in the bridge circuit are connected to the opposite terminals of the line voltage means and in which a second pair of opposite terminals in the bridge circuit are connected between the center tap of the load and the emitters of the semi-conductors and in which the opposite terminals of the load are connected to the collectors of the semi-conductors and in which the third windings in each magnetic amplifier are connected between the base and emitter of a different semi-conductor.

26. The combination set forth in claim 18 in which first and second bridge circuits are connected in the output circuitry and in which the load has a center tap connected to a first terminal in the line voltage means and in which the third winding in each magnetic amplifier is connected between the emitter and base of a different one of the semi-conductors and in which a first pair of opposite terminals in each bridge circuit is connected between the emitter and collector of a different one of the semi-conductors and in which one of the opposite terminals in a second pair in each bridge is connected to a second terminal in the line voltage means and the other opposite terminals in the second pair in each bridge are connected to the opposite terminals of the load.

27. The combination set forth in claim 18 in which bridge circuitry is provided in the output circuitry and in which the semi-conductors and the third windings are connected between opposite terminals of the bridge circuitry and in which the full load is included in a circuitry with the line voltage means, the bridge circuitry and the semi-conductors to produce a flow of current through the load upon a state of conductivity in the semi-conductors and in accordance with the polarities of the line voltage and the input signals.

28. The combination set forth in claim 18 in which the line voltage means is center-tapped and in which a bridge circuit formed from a plurality of unidirectional means is included in the output circuitry and in which the emitters and collectors of the semi-conductors are connected between a first pair of opposite terminals in the bridge and in which the opposite terminals of the line voltage means are connected between the second pair of opposite terminals in the bridge and in which the load is connected at one end to the center tap of the line voltage means and at the other end to the third windings in the magnetic amplifier and in which the third winding in each magnetic amplifier is connected between the emitter and base of a different one of the semi-conductors.

29. The combination set forth in claim 18 in which a plurality of bridge circuits are included in the output circuitry and in which each bridge circuit includes a plurality of unidirectional means connected to form first, second, third and fourth terminals and in which the opposite terminals of the line voltage means are connected to first terminals in each bridge circuit and in which the load is connected to second terminals in each bridge circuit opposite to the first terminals and in which the emitters and collectors of the semi-conductors are connected to the third and fourth terminals in each bridge circuit and in which the third windings in the different magnetic amplifiers are connected between the emitters and bases of the different semi-conductors.

References Cited in the file of this patent

UNITED STATES PATENTS

| | | |
|---|---|---|
| 2,653,282 | Darling | Sept. 22, 1953 |
| 2,730,574 | Belsey | Jan. 10, 1956 |

(Other references on following page)

UNITED STATES PATENTS

| | | |
|---|---|---|
| 2,740,086 | Evans et al. | Mar. 27, 1956 |
| 2,760,088 | Pittman et al. | Aug. 21, 1956 |
| 2,767,364 | Guggi | Oct. 16, 1956 |
| 2,767,365 | Guggi | Oct. 16, 1956 |
| 2,773,132 | Bright | Dec. 4, 1956 |
| 2,798,904 | Alexanderson | July 9, 1957 |
| 2,827,603 | Fingerett et al. | Mar. 18, 1958 |

OTHER REFERENCES

Radio Electronic Engineering, February 1954, pp. 13–15, Pittman Jr., "Transistor Control of Magnetic Amplifiers."

Geyger: "Magnetic Amplifier Circuits," Fig. 16.4, p. 225, McGraw-Hill Book Co., Inc., published Jan. 29, 1954.

Bell System Technical Journal, July 1954, pp. 827 and 847–858, Chase, Hamilton & Smith, "Transistors & Junction Diodes in Telephone Power Plants."

Publication: Transistor Electronics, by A. W. Lo et al.; Prentice-Hall, Inc., Englewood Cliffs, N. J., 1955; pp. 209–211.